United States Patent [19]

Kozuka

[11] Patent Number: 5,691,570
[45] Date of Patent: Nov. 25, 1997

[54] INTEGRATED CIRCUITS HAVING PATTERNS OF MIRROR IMAGES AND PACKAGES INCORPORATING THE SAME

[75] Inventor: Eiji Kozuka, Yokohama, Japan

[73] Assignee: Kabushiki Kaisha Toshiba, Tokyo, Japan

[21] Appl. No.: 719,336

[22] Filed: Sep. 25, 1996

Related U.S. Application Data

[63] Continuation of Ser. No. 311,540, Sep. 23, 1994, abandoned.

[30] Foreign Application Priority Data

Sep. 29, 1993 [JP] Japan ..................... 5-243213
Sep. 13, 1994 [JP] Japan ..................... 6-218606

[51] Int. Cl.$^6$ .............................. H01L 23/48; H01L 23/58
[52] U.S. Cl. .......................... 257/693; 254/48; 254/724; 254/784; 254/786
[58] Field of Search ................. 257/48, 693, 725, 257/723, 724, 784, 786

[56] References Cited

U.S. PATENT DOCUMENTS 5,165,067  11/1992  Wakefield et al. ............ 257/693
5,285,082  2/1994   Axer ............................ 257/48
5,473,198  12/1995  Hagiya et al. ................ 257/786

Primary Examiner—Tom Thomas
Assistant Examiner—David Ostrowski
Attorney, Agent, or Firm—Loeb & Loeb LLP

[57] ABSTRACT

Normal and reverse IC patterns are each a mirror image of the other. The normal and reverse IC patterns are simultaneously formed on a semiconductor wafer and are simultaneously tested. The wafer with these IC patterns is cut into chips, which are packaged. The normal and reverse IC packages show identical parasitic impedance and uniform performance.

11 Claims, 19 Drawing Sheets

FIG.1A
PRIOR ART

| | | | | |
|---|---|---|---|---|
| Vcc | 1 | | 44 | Vcc |
| $DQ_0$ | 2 | | 43 | $DQ_7$ |
| VssQ | 3 | | 42 | VssQ |
| $DQ_1$ | 4 | | 41 | $DQ_6$ |
| VccQ | 5 | | 40 | VccQ |
| $DQ_2$ | 6 | | 39 | $DQ_5$ |
| VssQ | 7 | | 38 | VssQ |
| $DQ_3$ | 8 | | 37 | $DQ_4$ |
| VccQ | 9 | | 36 | VccQ |
| NC | 10 | | 35 | NC |
| $\overline{WE}$ | 12 | | 33 | DQM |
| $\overline{CAS}$ | 13 | | 32 | CLK |
| $\overline{RAS}$ | 14 | | 31 | CKE |
| $\overline{CS}$ | 15 | | 30 | NC |
| BS | 16 | | 29 | $A_9$ |
| $A_{10}$ | 17 | | 28 | $A_8$ |
| $A_0$ | 18 | | 27 | $A_7$ |
| $A_1$ | 19 | | 26 | $A_6$ |
| $A_2$ | 20 | | 25 | $A_5$ |
| $A_3$ | 21 | | 24 | $A_4$ |
| Vcc | 22 | | 23 | Vss |

FIG.1B
PRIOR ART

| | | | | |
|---|---|---|---|---|
| Vcc | 44 | | 1 | Vcc |
| $DQ_7$ | 43 | | 2 | $DQ_0$ |
| VssQ | 42 | | 3 | VssQ |
| $DQ_6$ | 41 | | 4 | $DQ_1$ |
| VccQ | 40 | | 5 | VccQ |
| $DQ_5$ | 39 | | 6 | $DQ_2$ |
| VssQ | 38 | | 7 | VssQ |
| $DQ_4$ | 37 | | 8 | $DQ_3$ |
| VccQ | 36 | | 9 | VccQ |
| NC | 35 | | 10 | NC |
| DQM | 33 | | 12 | $\overline{WE}$ |
| CLK | 32 | | 13 | $\overline{CAS}$ |
| CKE | 31 | | 14 | $\overline{RAS}$ |
| NC | 30 | | 15 | $\overline{CS}$ |
| $A_9$ | 29 | | 16 | BS |
| $A_8$ | 28 | | 17 | $A_{10}$ |
| $A_7$ | 27 | | 18 | $A_0$ |
| $A_6$ | 26 | | 19 | $A_1$ |
| $A_5$ | 25 | | 20 | $A_2$ |
| $A_4$ | 24 | | 21 | $A_3$ |
| Vss | 23 | | 22 | Vcc |

INTEGRATED CIRCUITS HAVING PATTERNS OF MIRROR IMAGES AND PACKAGES INCORPORATING THE SAME

This is a continuation of application Ser. No. 08/311,540, filed Sep. 23, 1994, now abandoned.

BACKGROUND OF THE INVENTION

1. Field of the Invention

The present invention relates to a package of a semiconductor device made of an integrated circuit (IC), and particularly, to a semiconductor device having a lead frame of normal or reverse pin arrangement. The present invention also relates to a method of manufacturing such a semiconductor device, a photomask used for manufacturing the semiconductor device, and an apparatus for testing the semiconductor device.

2. Description of the Prior Art

Various kinds of semiconductor devices are manufactured according to user's requirements. The semiconductor devices are classified into several groups according to sealing materials used for the devices and the arrangements and shapes of external I/O pins of the devices.

There are TSOP (thin small package) semiconductor devices. The TSOP devices have thin resin layers and are mounted on both surfaces of a circuit board, to improve board density. There are two kinds of TSOP devices, one having a normal pin arrangement so that they are mounted on one surface of a circuit board, and the other having a reverse pin arrangement so that they are mounted on the other surface of the circuit board. The reverse pin arrangement is a mirror image of the normal pin arrangement. FIG. 1A shows a memory package having a normal arrangement of 44 pins, and FIG. 1B shows a memory package having a reverse arrangement of 44 pins, according to the prior art. The reverse pin arrangement of FIG. 1B is a mirror image of the normal pin arrangement of FIG. 1A. Except for the pin arrangement, the two packages are identical.

FIG. 2 is a sectional view showing the normal package of FIG. 1A. The package has a lead frame 101 and a semiconductor chip 102 mounted on the lead frame 101. The chip 102 is connected to pins 105 and 106 through bonding wires 103 and 104, respectively. This structure is sealed with resin into a package such that the pins 105 and 106 partly protrude from the package. The position of the lead frame 101 is set so that the thickness of the resin on the chip 102 is equal to that under the lead frame 101. If these resin layers have different thicknesses, the thinner resin layer determines the reliability, such as crack resistance due to changes in temperature, of the package. Accordingly, equalizing the resin thicknesses optimizes the reliability of the package. The lead frame 101 is depressed with use of receiver and presser metal molds (not shown), so that the pins 105 and 106 are centered in the package and extend across the package.

FIG. 3 is a sectional view showing the reverse package of FIG. 1B. The semiconductor chip 102 of the package is the same as the semiconductor chip 102 of FIG. 2. Areas encircled with dotted lines in FIGS. 2 and 3 correspond to each other. The package of FIG. 3 has the reverse pin arrangement, and pins 105 and 106 are oppositely bent from those of FIG. 2. When the package of FIG. 3 is mounted on a circuit board, the chip 102 faces the circuit board. Accordingly, heat from the chip 102 hardly dissipates away, to thereby deteriorate the reliability of the package. To solve this problem, there is a technique of changing the wiring patterns of the reverse device.

High-integration large-capacity semiconductor memories have been developed. These memories are large in size. To mount such a large semiconductor chip in a conventional small package, various assembly techniques have been proposed. One of the techniques is an LOC (lead on chip) method that extends one end of each pin up to a semiconductor chip. FIG. 4 is a sectional view showing a package having a normal pin arrangement assembled according to the LOC method. One end of each of pins 112 and 113 extends up to a semiconductor chip 111. The pins 112 and 113 are connected to the chip 111 through bonding wires 114 and 115, respectively. The chip 111 is sealed with resin into a package 116 such that the other ends of the pins 112 and 113 protrude from the package 116. A lead frame having the pins 112 and 113 is so positioned that the thickness of a resin layer under the chip 111 is equal to that on the lead frame. Unlike the prior art of FIG. 2, the lead frame of FIG. 4 is not depressed, so that the pins 112 and 113 are positioned above the center of the package 116. The tips of the pins 112 and 113 outside the package 116 are spaced from the bottom of the package 116 by the distance L, to mount the package 116 on a circuit board.

FIG. 5 is a sectional view showing a package having a reverse pin arrangement assembled according to the LOC method. The semiconductor chip 111 of this package is the same as that of FIG. 4. The chip 111 and a lead frame including pins 112 and 113 are upside-down compared with those of FIG. 4. The pins 112 and 113 of FIG. 5 are below the center of the package 116. Since the pins 112 and 113 of FIG. 5 are the same as those of FIG. 4, the length, bent position, and bent angle of a portion outside the package 116 of each of the pins 112 and 113 of FIG. 5 are the same as those of FIG. 4. As a result, the distance L' between the tips of the pins 112 and 113 and the bottom of the package 116 of FIG. 5 is not equal to the distance L of FIG. 4. If these normal and reverse packages 116 involving different distances L and L' are mounted on the opposite surfaces of a circuit board, the packages will be at different heights from the surfaces of the circuit board. Such a structure lowers board density and restricts the specifications of an apparatus for testing the packages 116 mounted on the circuit board. This kind of circuit board is unacceptable as a product.

To avoid this problem, the LOC method is usually carried out in one of the following two ways:

(1) Normal and reverse lead frames are applied to identical semiconductor chips (a conventional method 1).

(2) A common lead frame is applied to a semiconductor chip having a normal or reverse metal wiring pattern (a conventional method 2). FIGS. 6 and 7 are plan views showing semiconductor chips and lead frames fabricated according to the conventional method 2, in which FIG. 6 shows a normal configuration and FIG. 7 shows a reverse configuration. In FIG. 6, a pin 112 for an input signal $J_N$ is on the left side of the semiconductor chip 111 and is connected to a bonding wire 114, which is connected to a bonding pad (an external input connection terminal) 111a of the chip 111. The bonding pad 111a is connected to a metal wiring film 111b, which is connected to an internal circuit 111c on the left side of the chip 111. A pin 113 for an input signal $C_N$ is on the right side of the chip 111 and is connected to a bonding wire 115, which is connected to a bonding pad 111d of the chip 111. The bonding pad 111d is connected to a metal wiring film 111e, which is connected to an internal circuit 111f on the right side of the chip 111. In FIG. 7, a pin 113 for an input signal $C_R$ is on the left side of the chip 111A and is connected to a bonding wire 115, which is connected to a bonding pad 111a of the chip 111A. The bonding pad 111a is connected to a metal wiring film 111Ae, which is connected to an internal circuit 111f on the right side of the chip 111A. A pin 112 for an input signal $J_R$ is on the right side of the chip 111A and is connected to a bonding wire 114, which is connected to a bonding pad 111d. The bonding pad 111d is connected to a metal wiring film 111Ab, which is connected to an internal circuit 111c on the left side of the chip 111A.

The conventional methods 1 and 2 have the following problems:

(1) The conventional method 1 applies a normal or reverse lead frame to an identical semiconductor chip. Accordingly, it is not necessary to change the internal metal wiring film patterns on the chip according to the normal or reverse lead frame. In a reverse package, however, pins on the right side must be connected to bonding pads on the left side across the chip. As a result, normal and reverse packages have different lead lengths inside the packages. The different lead lengths cause differences in the parasitic impedance, such as inductance, resistance and capacitance, by the lead frames, so that the normal and reverse packages may present different performance in access time, noise, and timing margins.

(2) The conventional method 2 employs a semiconductor chip having a normal or reverse metal wiring film pattern. The normal and reverse metal wiring film patterns involve wiring films of different lengths extending from bonding pads to internal circuits. The different wiring lengths change the parasitic impedance, such as the inductance, resistance and capacitance by the wiring films. As a result, the normal and reverse semiconductor chips show different performance in access time, noise, and timing margins.

Another problem is an identification problem. An alphabetic or numeric identifier is attached to a semiconductor device in the last metal wiring process, to identify whether the device is of normal type or of reverse type. When testing semiconductor devices, each device is identified visually by an inspector to determine whether it is normal or reverse. Such manual identification takes time and causes errors. If a normal device is tested as a reverse device, or if a reverse device is tested as a normal device, the device must be correctly tested again. Such a repetition of tests deteriorates metal film at connections on a semiconductor chip. Errors will also occur in a product test. If a normal product is tested as a reverse product, or if a reverse product is tested as a normal product, a product that is sound will be judged as defective.

To manufacture normal and reverse packages, normal and reverse masks must be prepared, and normal and reverse manufacturing processes must be accomplished. This requires more manufacturing time. The manufacturing processes will vary from each other and not provide uniform products or lots.

SUMMARY OF THE INVENTION

An object of the present invention is to provide a semiconductor device serving as a normal or reverse device to secure the same parasitic impedance and performance. It is easy to determine whether the device is normal or reverse.

Another object of the present invention is to provide a semiconductor device manufacturing method that minimizes the number of required masks and the number of manufacturing processes, to shorten product development time and improve productivity. Masks used for manufacturing semiconductor devices are also provided by the present invention.

Still another object of the present invention is to provide normal and reverse semiconductor devices that are easy to test and identify, a method of manufacturing the semiconductor devices, and a probe card for testing the semiconductor devices.

Still another object of the present invention is to provide a semiconductor device capable of increasing its capacity without changing a mask, and provide a method of manufacturing such a semiconductor device.

In order to accomplish the objects, a first aspect of the present invention forms a normal IC pattern (a first IC pattern) and a reverse IC pattern (a second IC pattern) on a glass substrate to form a photomask (a reticle) as shown in FIGS. 9 to 11. These IC patterns are each a mirror image of the other.

A second aspect of the present invention employs the mask of the first aspect, to simultaneously form the first and second ICs on a single semiconductor wafer as shown in FIG. 12. Namely, the two kinds of ICs are manufactured in a single manufacturing process, to shorten manufacturing time and reduce costs. Since the two kinds of ICs are simultaneously manufactured in the same manufacturing process, they are free from fluctuations due to differences between manufacturing lots, to provide uniform products. The first and second ICs are each a mirror image of the other, so that there are no differences between the lengths of metal wiring film on the first and second ICs when they are packaged. Accordingly, the packaged first and second ICs show identical parasitic impedance and provide the same performance.

A third aspect of the present invention forms a common test circuit in a common area between first and second ICs on a semiconductor chip as shown in FIGS. 13 and 14, to improve area efficiency.

A fourth aspect of the present invention employs a single probe card shown in FIG. 15 to simultaneously test first and second ICs formed on a single semiconductor wafer. It is not necessary to exchange probe cards from one to another, thereby improving productivity.

A fifth aspect of the present invention forms, in each of first and second ICs, bonding pads are symmetrically arranged with respect to a centerline of a corresponding chip as shown in FIG. 16, so that identical lead frames are applicable to the normal and reverse ICs.

A sixth aspect of the present invention arranges a decision circuit on each of first and second ICs, to determine the type of the corresponding IC, as shown in FIGS. 17 to 20. The decision circuit correctly determines the type of the corresponding IC during a characteristic test of the IC on a wafer and during a product test of the IC in a package, thereby improving productivity.

A seventh aspect of the present invention connects first and second ICs to each other through metal wirings 449 on a semiconductor chip as shown in FIGS. 21 to 23. When it is required to double the memory capacity, a first IC 122 and a second IC 124 are formed on a single chip 12 as shown in FIG. 21. When a smaller memory capacity is required, the first and second ICs are cut into separate chips 12 and are independently packaged as shown in FIG. 22. The capacity is easily changed without changing a mask.

Other and further objects and features of this invention will become obvious upon an understandings of the illustrative embodiments about to be described in connection with the accompanying drawings or will be indicated in the appended claims, and various advantages not referred to therein will occur to one skilled in the art upon employing of the invention in practice.

BRIEF DESCRIPTION OF THE DRAWINGS

FIG. 1A shows a semiconductor device having a normal pin arrangement according to the prior art;

FIG. 1B shows a semiconductor device having a reverse pin arrangement according to the prior art;

DETAILED DESCRIPTION OF THE EMBODIMENTS

Figure 2:
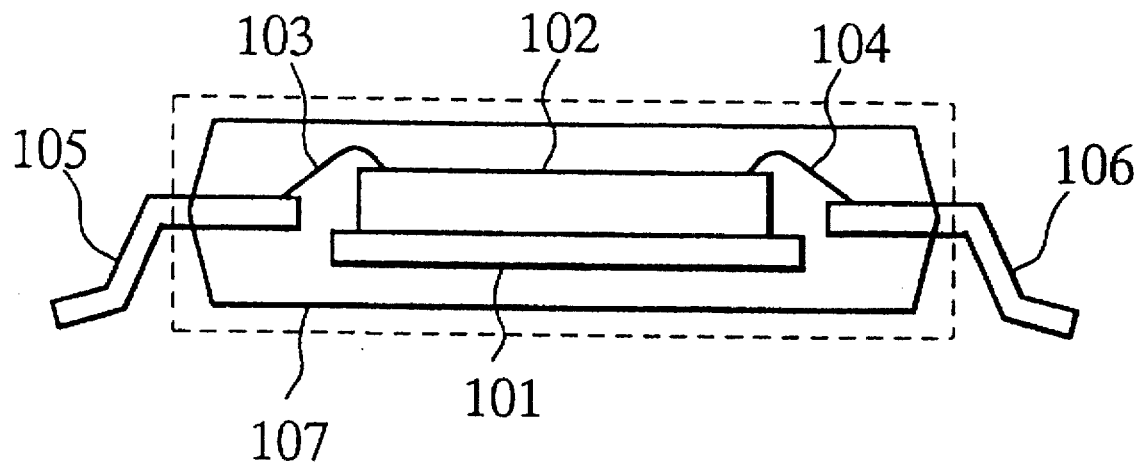
FIG. 2 is a sectional view showing the normal semiconductor device of FIG. 1A.
Figure 3:
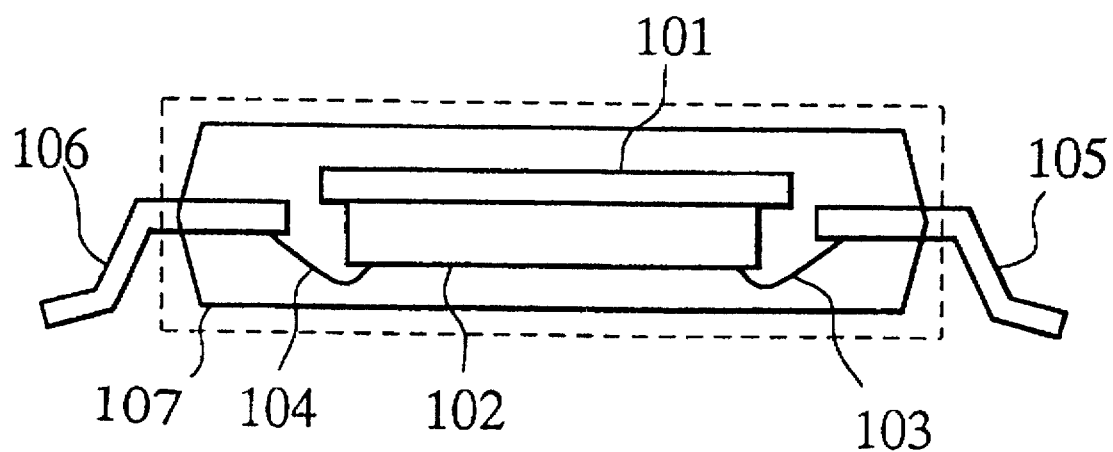
FIG. 3 is a sectional view showing the reverse semiconductor device of FIG. 1B mounting the normal semiconductor chip shown in FIG. 2.
Figure 4:
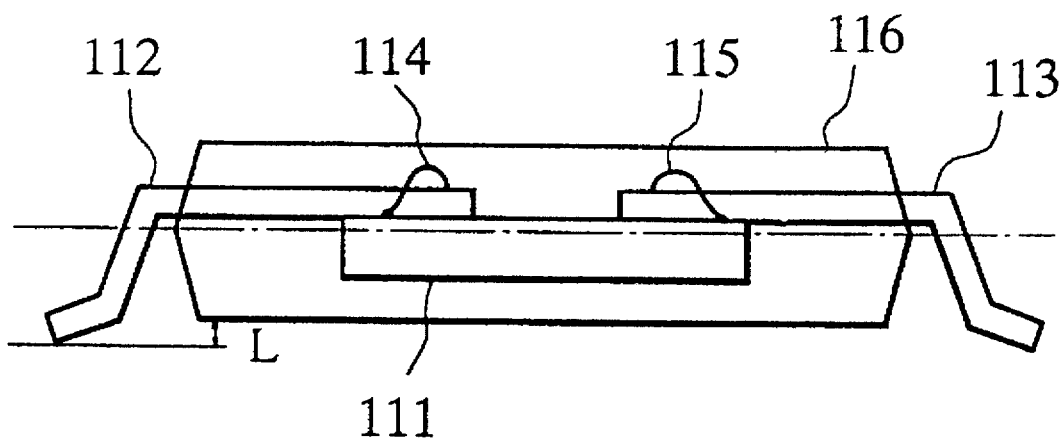
FIGS. 4 and 5 are sectional views showing normal and reverse semiconductor devices, respectively, fabricated according to a conventional LOC method, both mounting the normal semiconductor chips.
Figure 5:
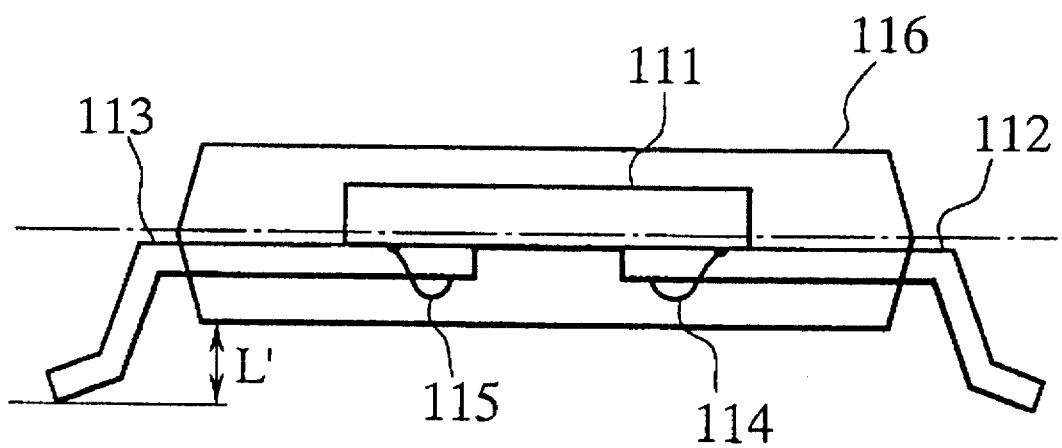
Figure 6:
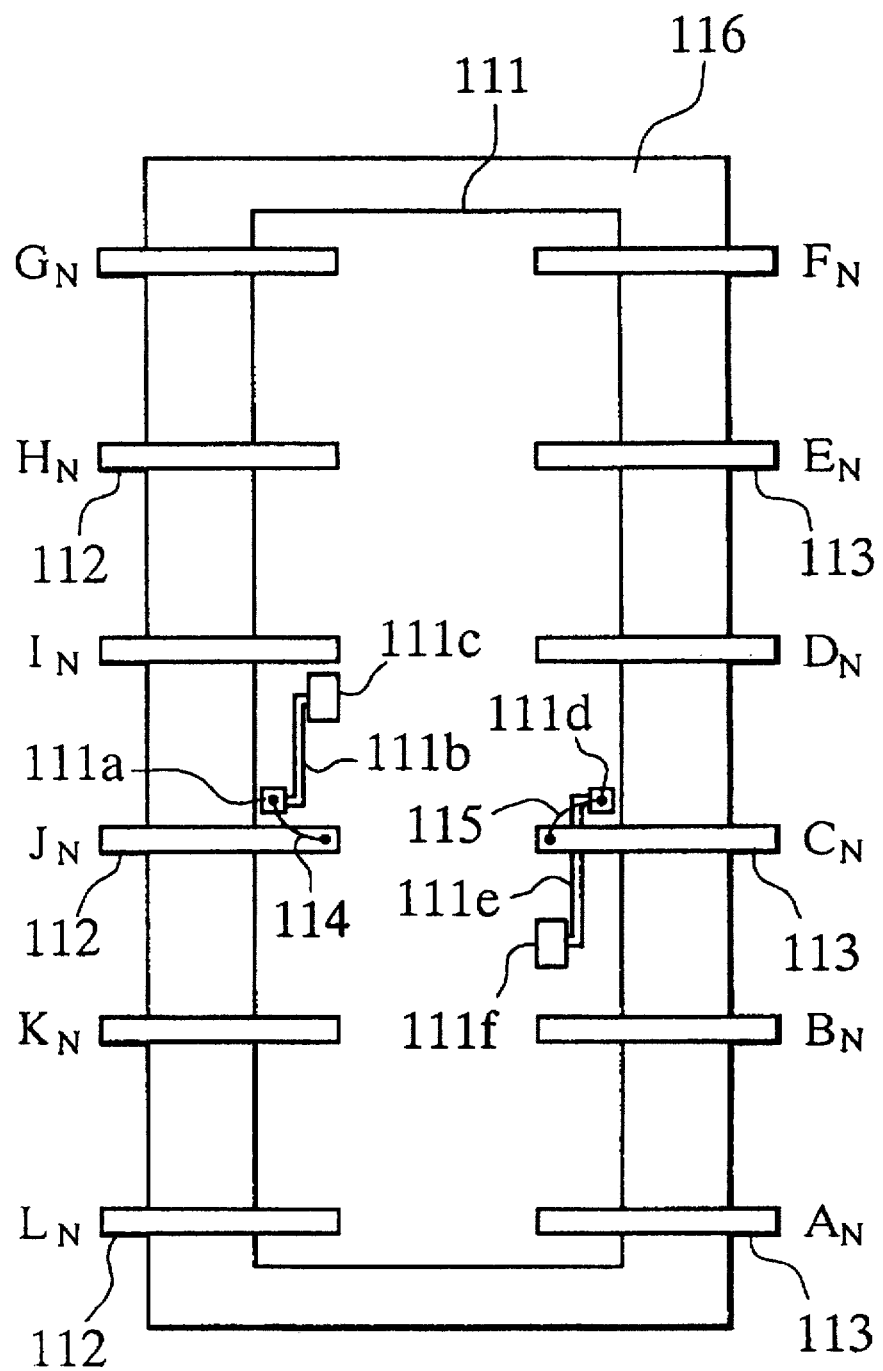
FIGS. 6 and 7 are plan views showing normal and reverse semiconductor devices, respectively, according to the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 8:
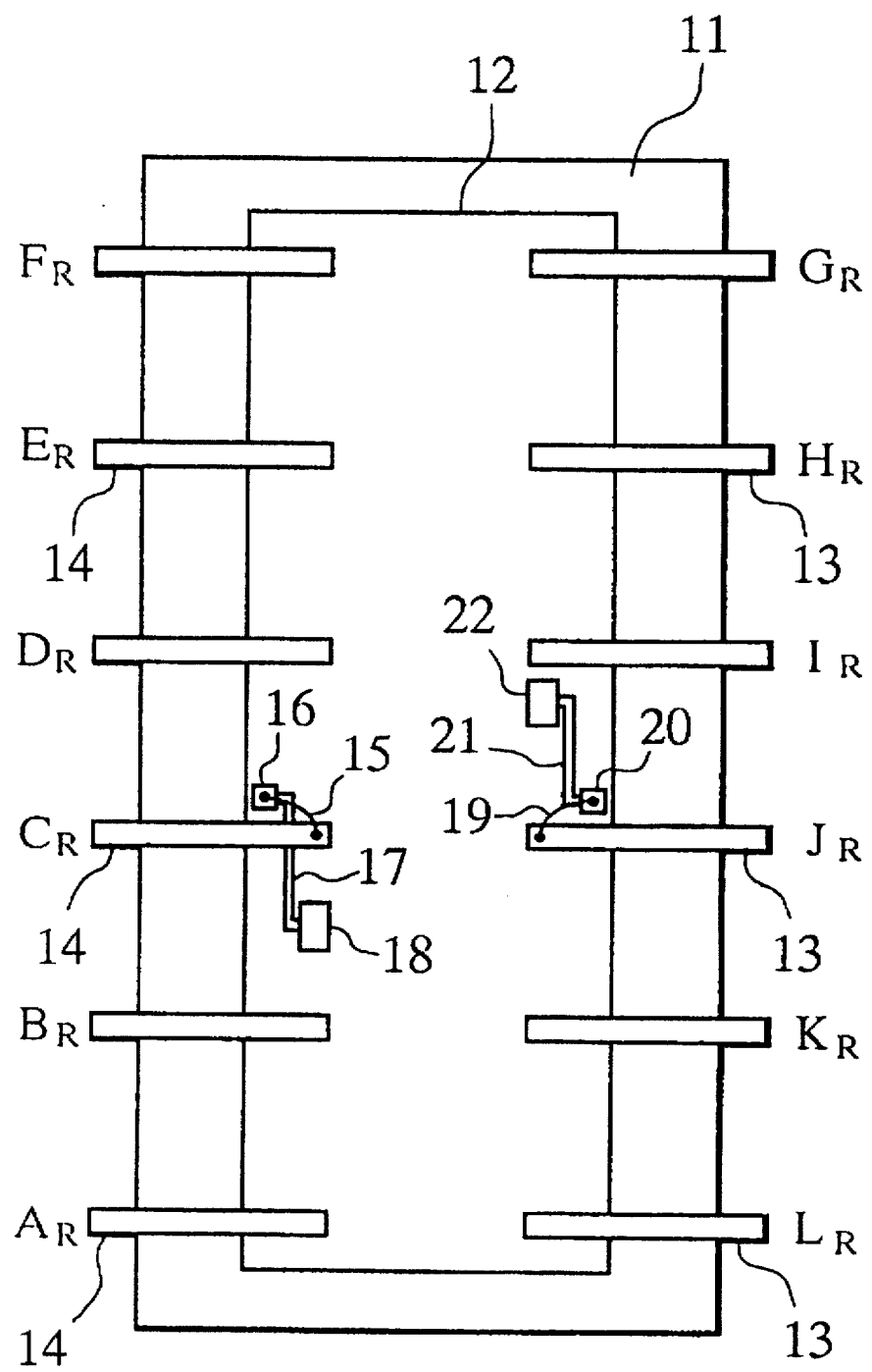
FIG. 8 is a plan view showing a semiconductor device according to a first embodiment of the present invention.

FIG. 8 is a plan view showing a semiconductor device having a lead frame 11 and a semiconductor chip 12, according to a first embodiment of the present invention. The chip 12 has a reverse IC pattern that is a mirror image of a normal IC pattern. The lead frame 11 is of reverse type. Unlike the conventional reverse IC that involves only reversely positioned bonding pads, the reverse IC of FIG. 8 is a mirror image of a normal IC. Accordingly, internal circuits 18 and 22 of the chip 12 are in the vicinities of corresponding pins 14 and 13 of the lead frame 11.

Figure 7:
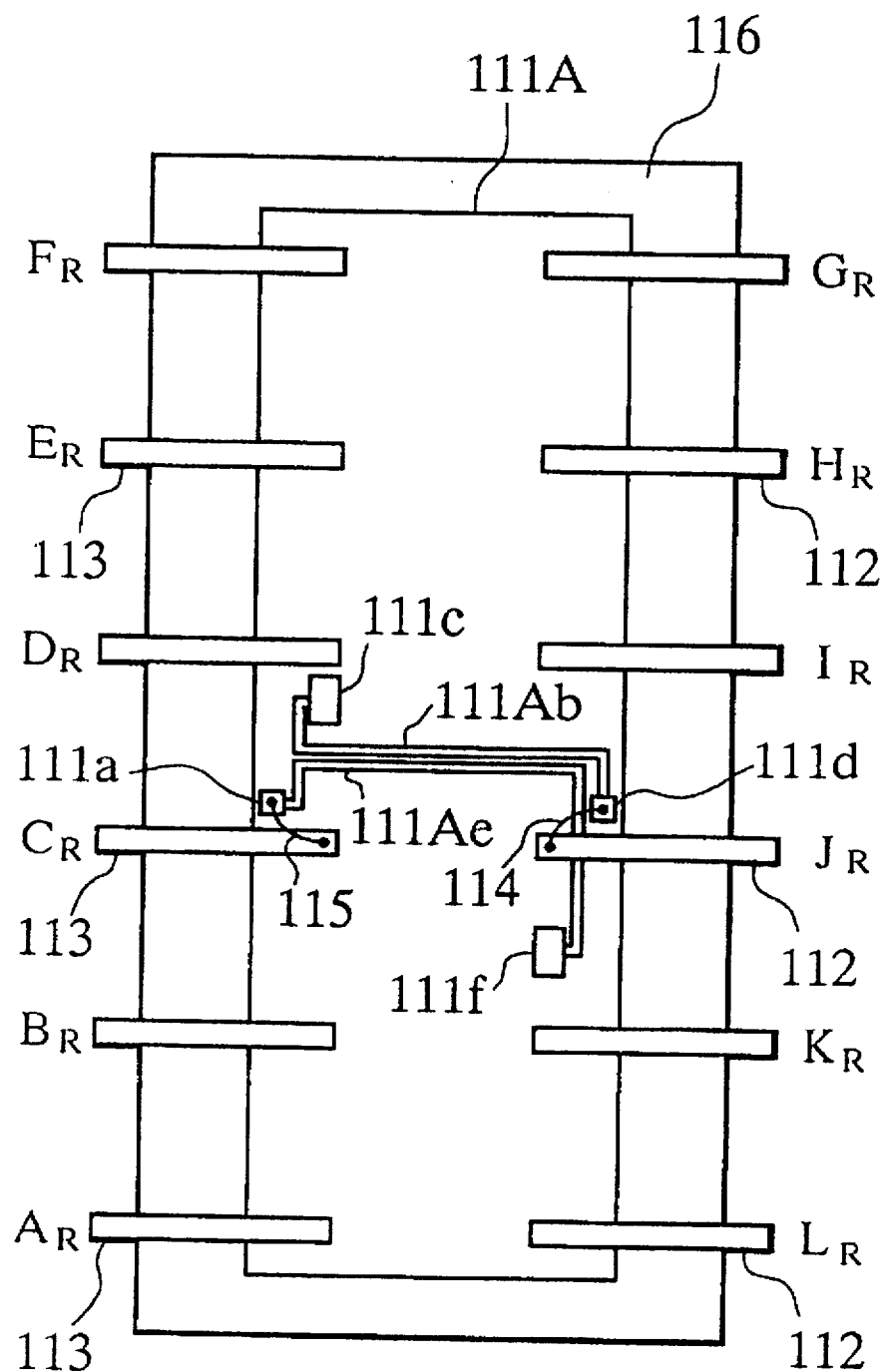

The chip 12 is sealed with resin into a package. The pins (external I/O terminals) 13 and 14 protrude from each side of the package. For example, an end of a pin 14 (corresponding to the pin 113 of FIG. 7) for supplying an input signal $C_R$ is on the left side of the chip 12 and is connected to a bonding wire 15, which is connected to a bonding pad 16. The bonding pad 16 is connected to a metal wiring film 17, which is connected to an internal circuit 18 (corresponding to the internal circuit 111f of FIG. 7) that is on the left side of the chip 12. A pin 13 (corresponding to the pin 112 of FIG. 7) for supplying an input signal $J_R$ is on the right side of the chip 12 and is connected to a bonding wire 19, which is connected to a bonding pad 20. The bonding pad 20 is connected to a metal wiring film 21, which is connected to an internal circuit 22 (corresponding to the internal circuit 111c of FIG. 7) that is on the right side of the chip 12. Accordingly, positional relationships between the pins of a lead frame and the bonding pads on a semiconductor chip, positional relationships between the bonding pads and internal metal wiring films, and positional relationships between the internal wirings and internal circuits are unchanged on both the normal and reverse ICs because the ICs are each a mirror image of the other. As a result, normal and reverse semiconductor devices have the same access time, noise, and timing margins, to provide uniform performance. Consequently, this embodiment improves a yield of semiconductor devices.

Figure 9:
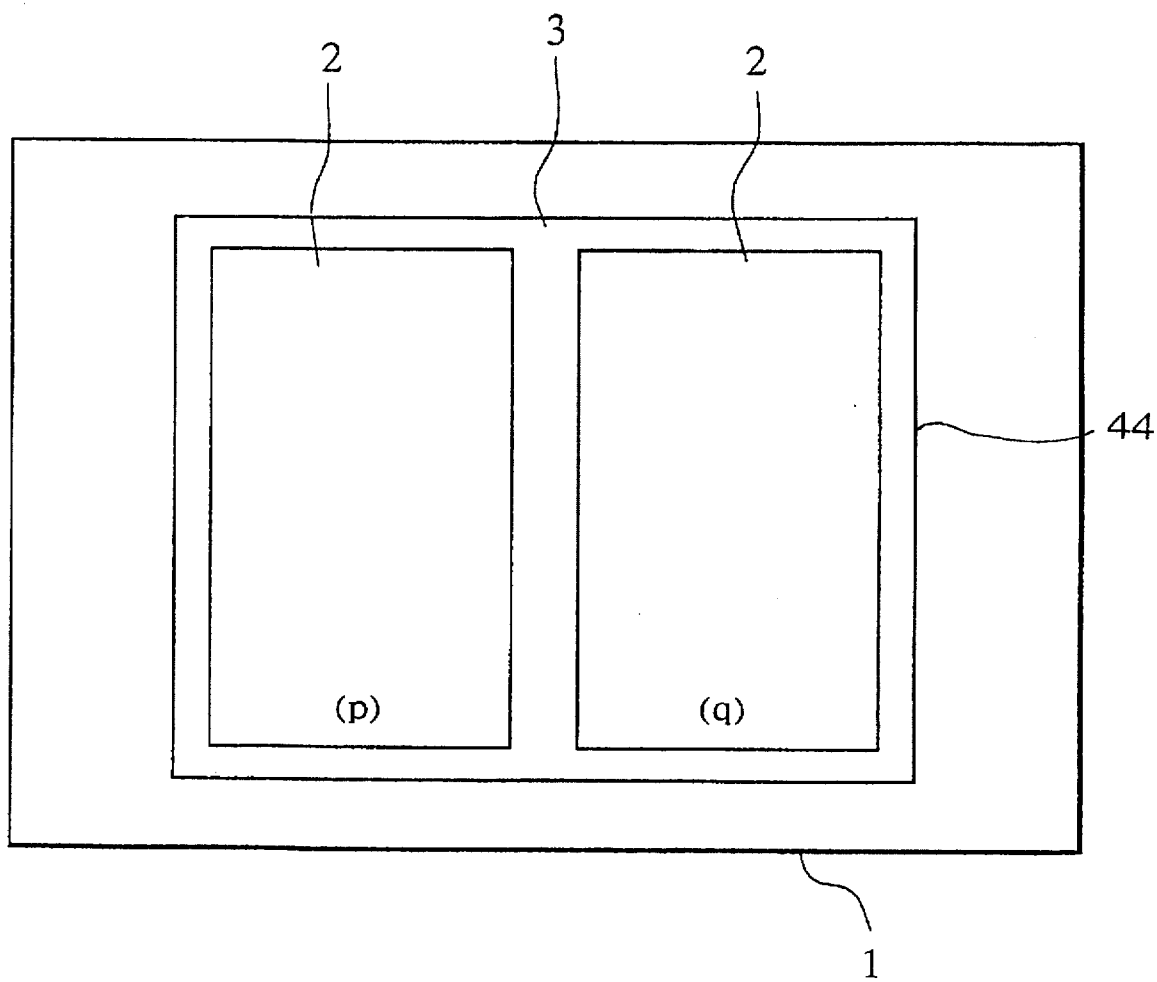
FIG. 9 shows a mask used for manufacturing normal and reverse semiconductor chips according to the first embodiment of the present invention.

FIGS. 9 to 12 show photomasks (reticles) used for simultaneously manufacturing normal and reverse ICs on a single semiconductor wafer. FIG. 9 shows a mask for simultaneously forming a normal IC and a reverse IC. The mask includes a normal IC pattern p and a reverse IC pattern q that is a mirror image of the normal IC pattern p. A scribe line area 3 is formed between IC areas 2. A dicing line 44 surrounds the IC areas 2, to cut and separate the IC areas 2. The mask of FIG. 9 is used to sequentially expose a semiconductor wafer by a stepper.

Figure 10:
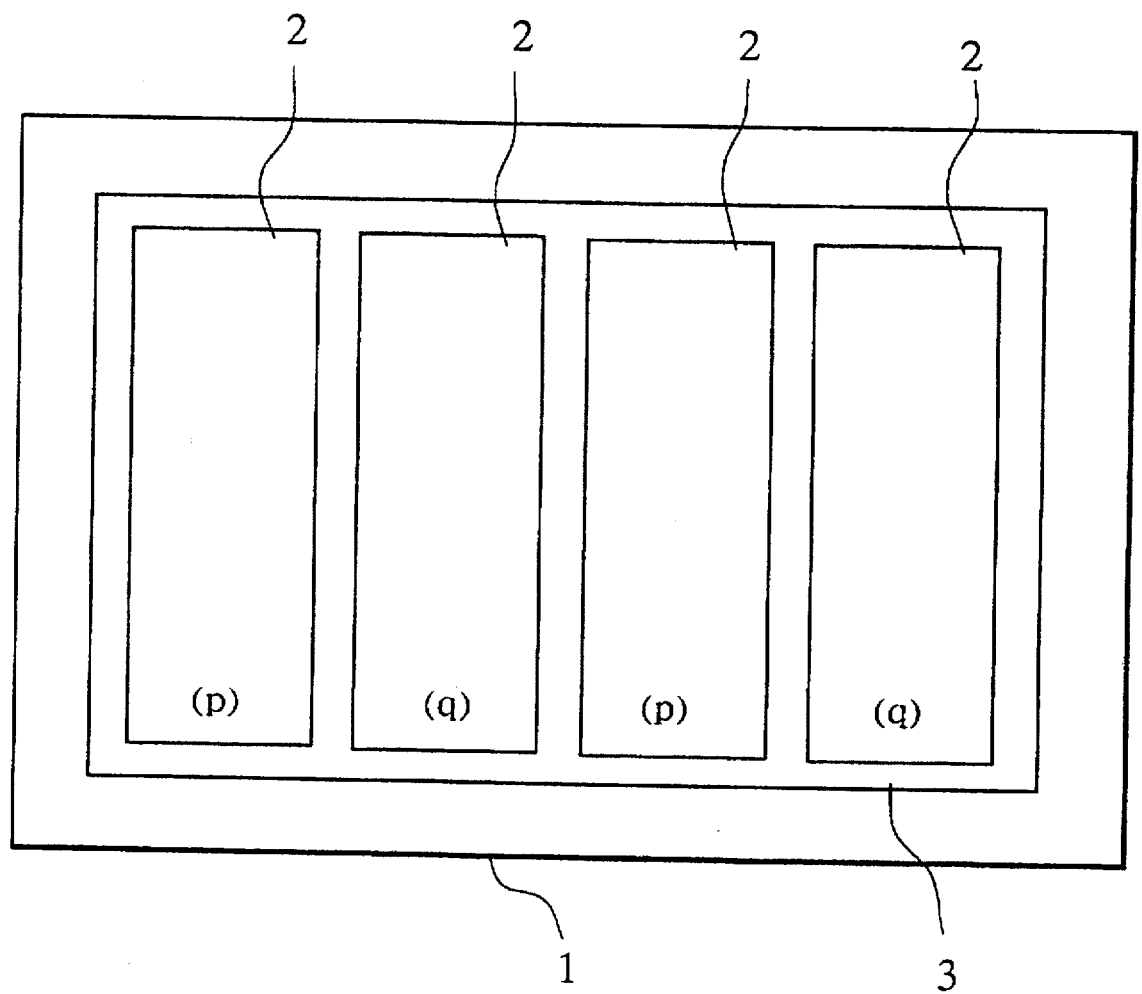
FIGS. 10 and 11 show masks used for manufacturing pairs of normal and reverse semiconductor chips according to the first embodiment of the present invention.

FIG. 10 shows a mask for forming two normal ICs and two reverse ICs in a line. The mask includes two normal IC patterns p and two reverse IC patterns q that are alternately arranged. The reverse IC pattern q is a mirror image of the normal IC pattern p.

Figure 11:
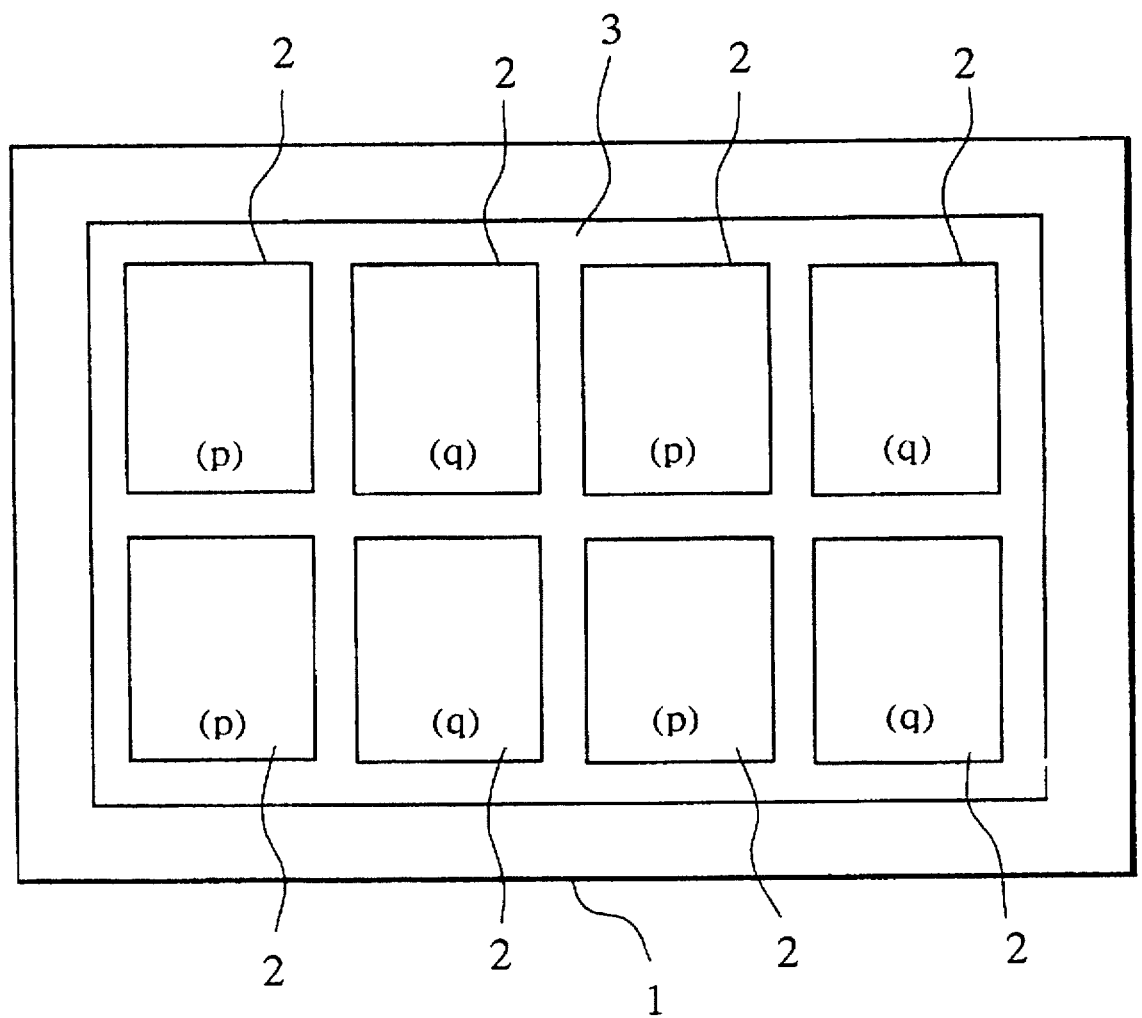

FIG. 11 shows a mask for forming four normal ICs and four reverse ICs in two rows. Each row includes two normal IC patterns p and two reverse IC patterns q alternately arranged. The reverse IC pattern q is a mirror image of the normal IC pattern p. In FIGS. 10 and 11, the same parts as those of FIG. 9 are represented with like reference numerals, and they will not be explained again.

According to the prior art, different manufacturing processes must be performed for normal and reverse semiconductor chips, respectively, because the chips need different masks for wiring. Namely, the prior art requires two different wiring masks and two manufacturing processes or lines, to fabricate the normal and reverse semiconductor chips. This results in increasing mask preparation time and manufacturing time. On the other hand, the normal IC patterns and the reverse IC patterns are included on a single mask by embodiments of the present invention. Since both patterns are simultaneously exposed on a single semiconductor wafer, only one manufacturing process is sufficient. According to the present invention, all IC patterns are subjected to the same misalignment in the mask and shape fluctuations in the manufacturing process, so that lot-to-lot variations are cancelled and manufacturing time is shortened. According to the present invention, a reverse pattern may be an upside-down mirror image, instead of a right and left mirror image, of a normal pattern.

Figure 12:
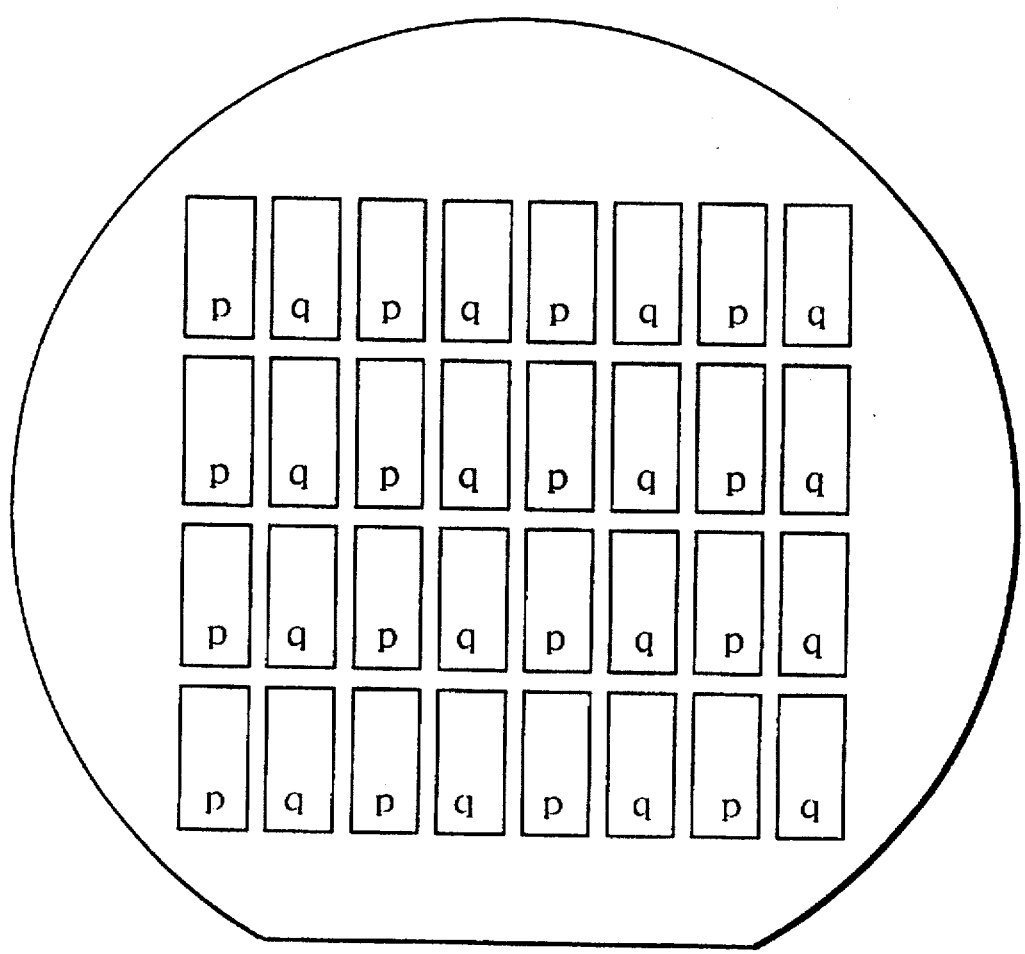
FIG. 12 shows a semiconductor wafer with a mask according to the first embodiment of the present invention.

FIG. 12 shows a semiconductor wafer on which IC patterns are sequentially exposed by a stepper with use of the photomask (reticle) of FIG. 9. There are normal IC patterns p and reverse IC patterns q. The reverse IC pattern q is a mirror image of the normal IC pattern p. Four pairs of normal and reverse IC patterns are alternately arranged in each of four rows on the semiconductor wafer. The arrangement of FIG. 12 is only an example. The number of pairs of normal and reverse IC patterns on a wafer is determined according to the area of the wafer and the exposing area of a stepper. The number of IC patterns in a mask also determines the total number of IC patterns on a wafer, as shown in FIGS. 10 and 11. The number of IC patterns is properly determined according to requirements. In FIGS. 9 to 11, a normal IC pattern and a reverse IC pattern forms a pair so that the total number of IC patterns is even. It is possible to employ a mask including an odd number of IC patterns. More normal products are needed in the market than reverse products, so that more normal IC patterns may be formed than reverse IC patterns on a wafer. For example, a mask having two normal IC patterns and a reverse IC pattern may be used to expose a wafer by a stepper.

Although the above explanation is based on photolithography employing a photomask or a reticle, the present invention is also applicable to electron beam exposure or X-ray exposure, or even a direct writing method without a mask or a reticle. In any case, the present invention forms at least a pair of normal and reverse IC patterns each being a mirror image of the other on a semiconductor wafer.

Figure 13:
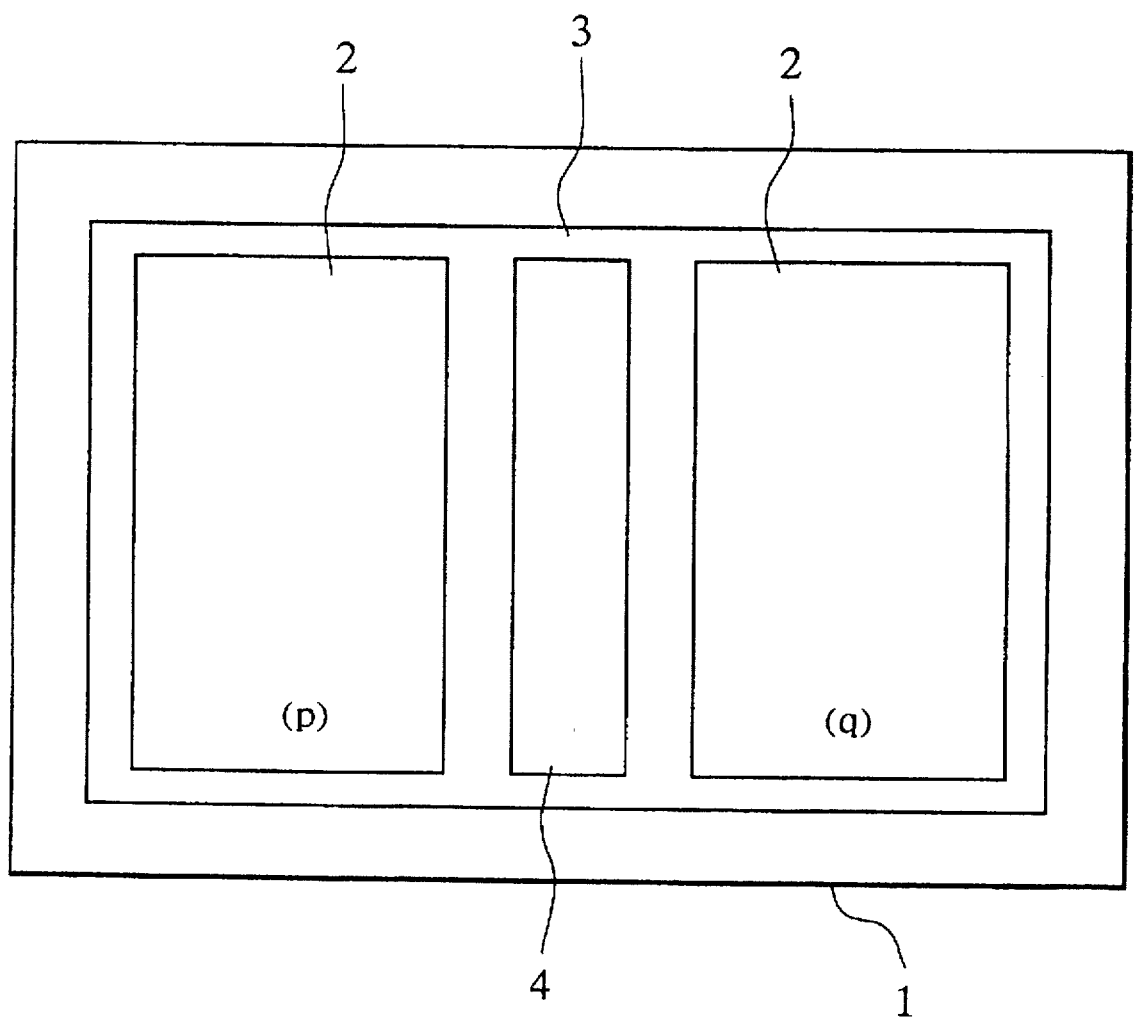
FIGS. 13 and 14 show a mask used for manufacturing normal and reverse IC patterns and a test circuit area shared by the IC patterns, according to a second embodiment of the present invention.
Figure 14:
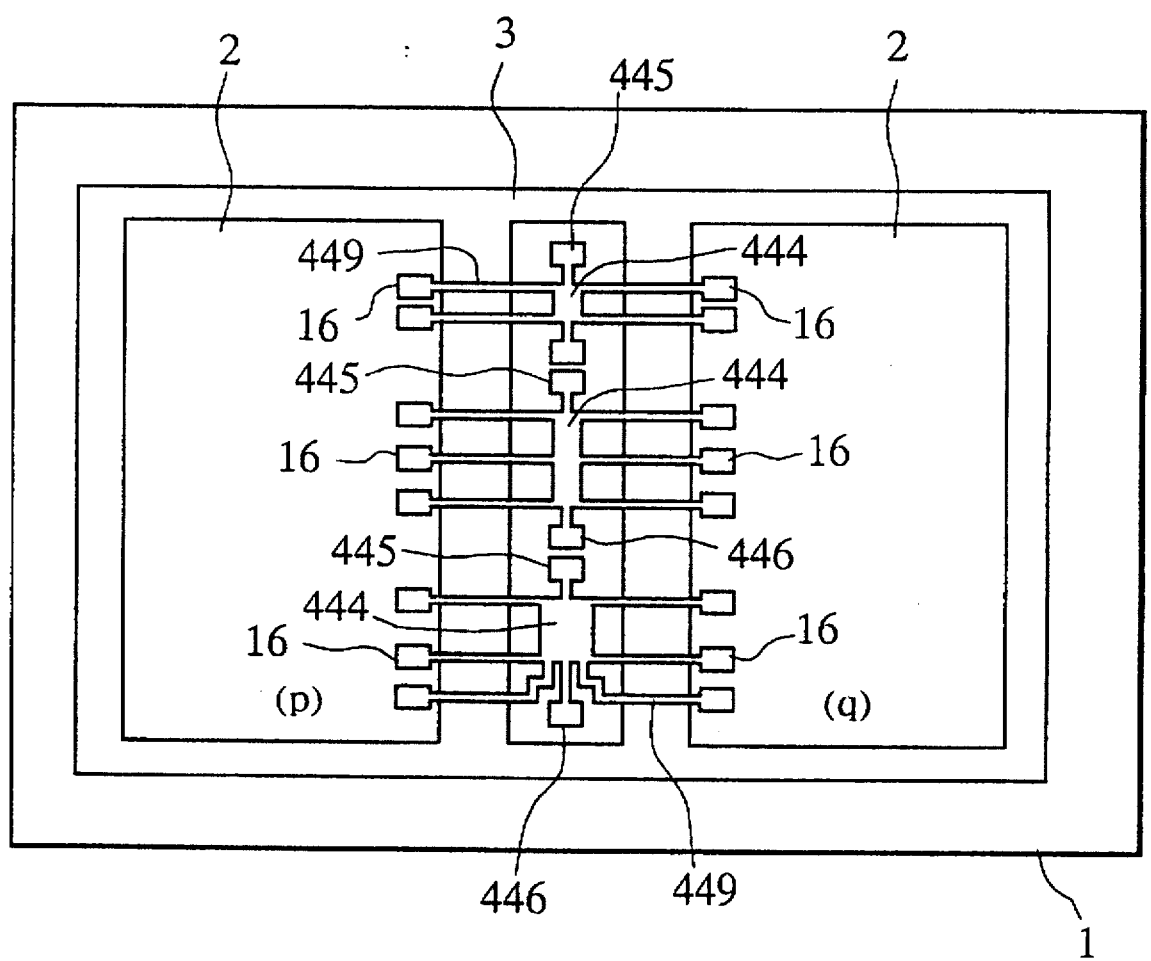

FIG. 13 shows a photomask or a reticle according to the second embodiment of the present invention. The mask includes a normal IC pattern, a reverse IC pattern, and a test circuit pattern. The test circuit pattern is used to form a test circuit that carries out, for example, a reliability test on the normal and reverse ICs. FIG. 14 shows only the metal wirings around the test circuit. The test circuit area 4 is used to form the test circuit 444, a connection terminal 445 for supplying an external control signal to the test circuit 444, and an internal signal output terminal 446 used to monitor test signals. The normal and reverse ICs are symmetrical with respect to the test circuit area 4, so that the ICs are easily connected to the test circuit through metal wirings 449. Unlike the prior art that provides each of normal and reverse ICs with a test circuit, the second embodiment of the present invention lets two, four, eight, or more ICs share a test circuit, thereby increasing the effective area of each chip and the integration of a semiconductor product.

Figure 15A:
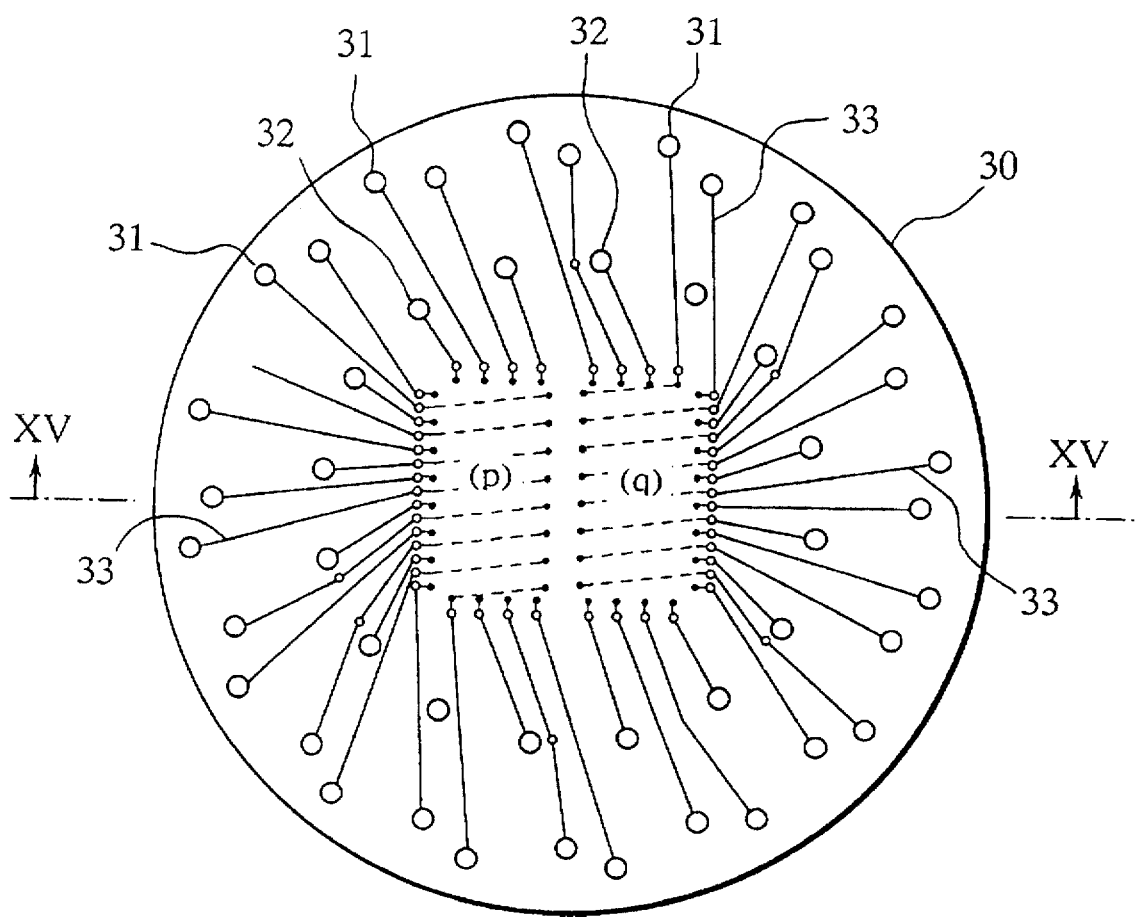
FIG. 15A and FIG. 15B show a probe card for testing a semiconductor wafer processed according to the first embodiment of the present invention.
Figure 15B:
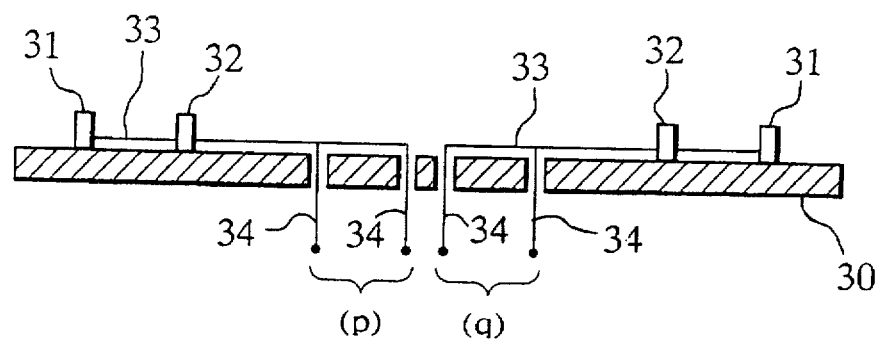

FIGS. 15A and 15B show a probe card for testing a semiconductor wafer having ICs according to the first embodiment of FIGS. 8 and 9. The positions of I/O terminals of a normal IC are not identical to those of a reverse IC. Accordingly, the prior art prepares a probe card for testing normal ICs and a probe card for testing reverse ICs. The probe card for normal ICs are not applicable to reverse ones, and the probe card for reverse ICs are not applicable to normal ones. On the other hand, the probe card of FIGS. 15A and 15B according to the present invention has normal test terminals p and reverse test terminals q, to simultaneously test normal and reverse ICs. The probe card has a disk-like base 30. Terminals 31 are equidistantly arranged along an outer circumference on the base 30, and terminals 32 are equidistantly arranged along an inner circumference on the base 30. The terminals 31 and 32 receive signals from an IC tester (not shown). The terminals are connected to wires 33, which are connected to normal and reverse probe needles 34 for normal and reverse ICs. The probe needles 34 pass through the base 30. The probe needles 34 simultaneously get in contact with the bonding pads 16 and 20 (FIG. 8) of the normal and reverse ICs, to test them. In this way, the present invention does not require two probe cards that must be exchanged from one to another to test normal and reverse ICs. The present invention thus saves labor and time and improves productivity.

Figure 16:
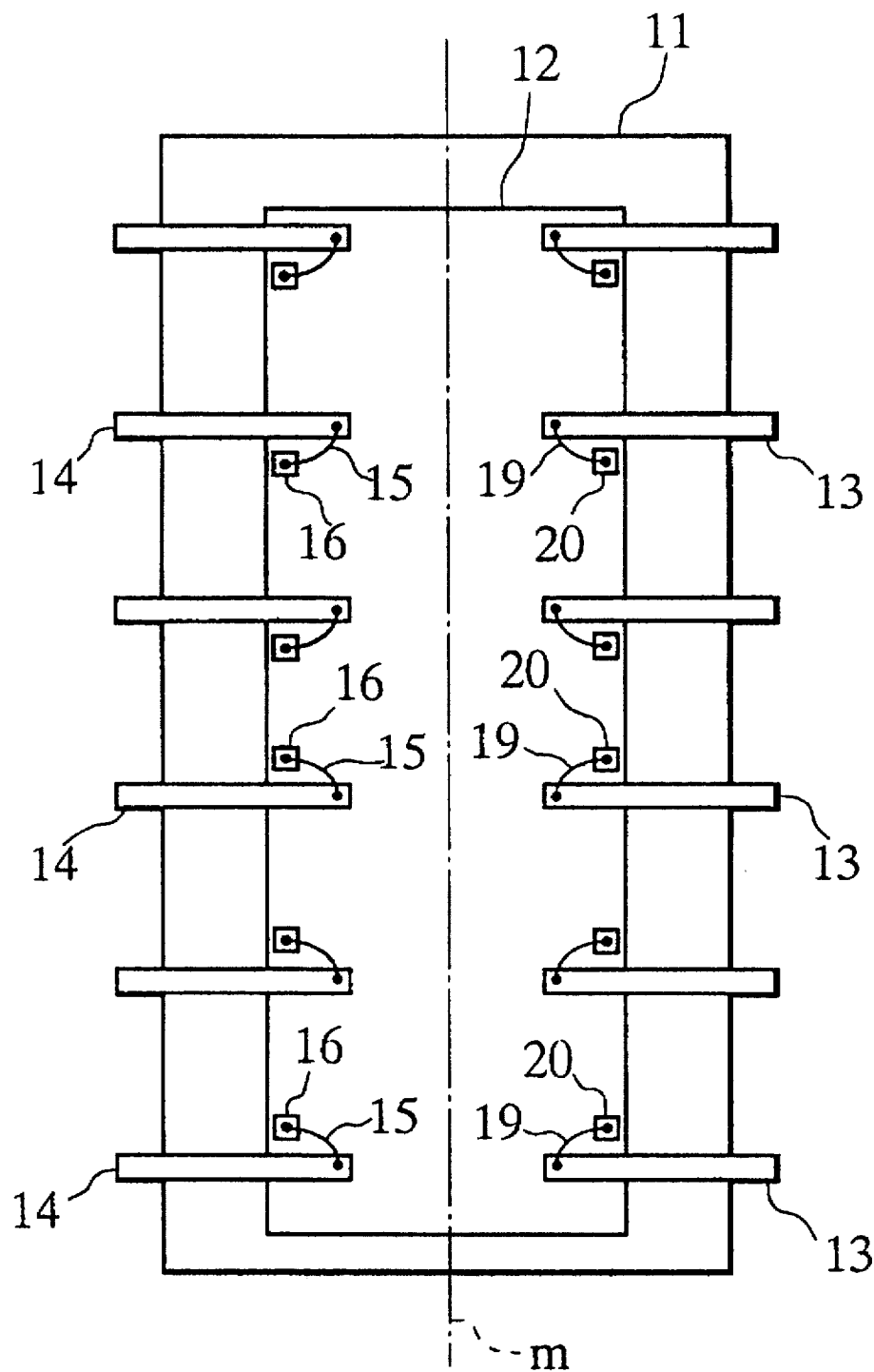
FIG. 16 is a plan view showing a semiconductor device having bonding pads that are symmetrical with respect to a centerline m of a semiconductor chip, according to a third embodiment of the present invention.

FIG. 16 shows bonding pads 16 and 20 formed on a semiconductor chip 12 according to the third embodiment of the present invention. Pins 13 and 14 protrude from the left and right sides of a lead frame 11. Unlike the first embodiment of FIG. 8, the bonding pads 16 and 20 are symmetrical with respect to a centerline m between the pins 13 and 14. The pins 13 are connected to the bonding pads 20 through bonding wires 19, and the pins 14 are connected to the bonding pads 16 through bonding wires 15. Since the bonding pads 16 and 20 are symmetrical with respect to the centerline m, the same lead frame can be used for normal and reverse IC chips, and a high productivity is achieved.

Figure 17:
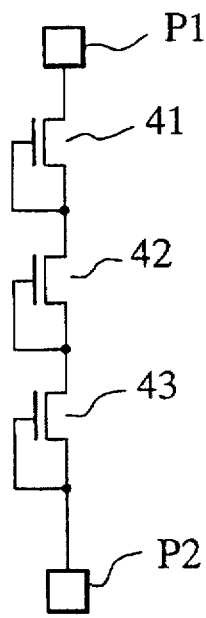
FIGS. 17 to 20 are circuit diagrams showing a decision circuit according to a fourth embodiment of the present invention.

FIG. 17 shows a decision circuit according to the fourth embodiment of the present invention. The decision circuit consists of n-channel MOS (NMOS) transistors 41, 42, and 43 connected in series between bonding pads P1 and P2. The gate and source of each of the NMOS transistors 41 to 43 is connected to each other. Under normal use according to specifications, the potential of the bonding pad P2 does not exceed the potential of the bonding pad P1. Accordingly, the NMOS transistors 41 to 43 are OFF to pass no current between the bonding pads P1 and P2. To carry out a test, the potential of the bonding pad P2 is set higher than that of the bonding pad P1, to turn ON all the NMOS transistors 41 to 43. The decision circuit is effective to determine whether a tested product is normal or reverse.

Figure 18:
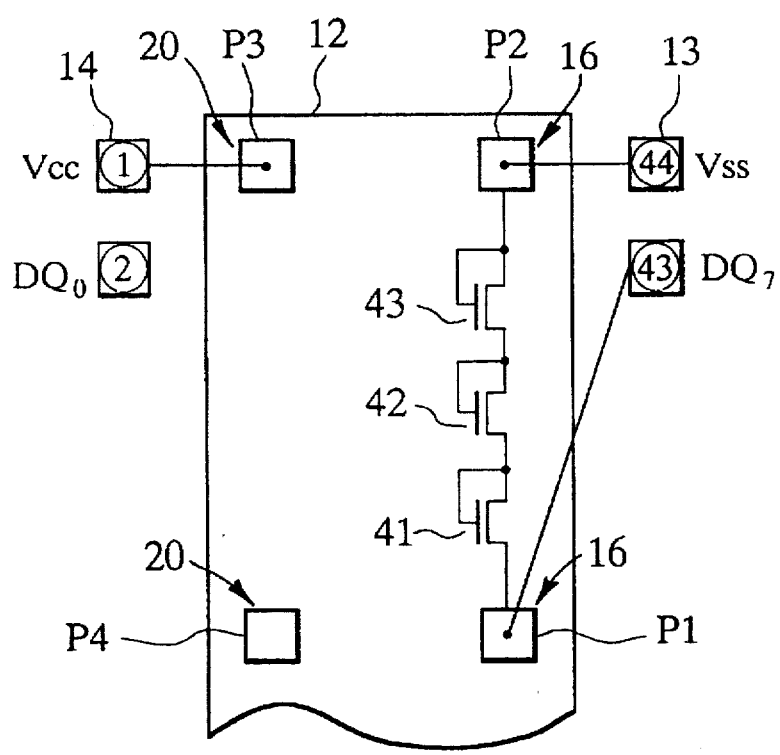

The decision circuit of FIG. 17 is applied to, for example, the semiconductor devices of FIGS. 1A and 1B. FIG. 18 shows the normal Semiconductor device provided with the decision circuit of FIG. 17. A 44th pin 13 for potential Vss is connected to a bonding pad P2, i.e., a bonding pad 16 of the semiconductor chip 12. A 43rd pin 13 for input data DQ7 is connected to a bonding pad P1, i.e., another bonding pad 16 of the chip 12. A 1st pin 14 for power source potential Vcc is connected to a bonding pad P3, i.e., a bonding pad 20 of the chip 12. A bonding pad P4, i.e., another bonding pad 20 of the chip 12 is disconnected. The decision circuit of FIG. 17 is connected between the bonding pads P1 and P2. A probe card is made to contact the bonding pads during a die sorting process, to determine the type of the product and test the operation of the product.

Figure 19:
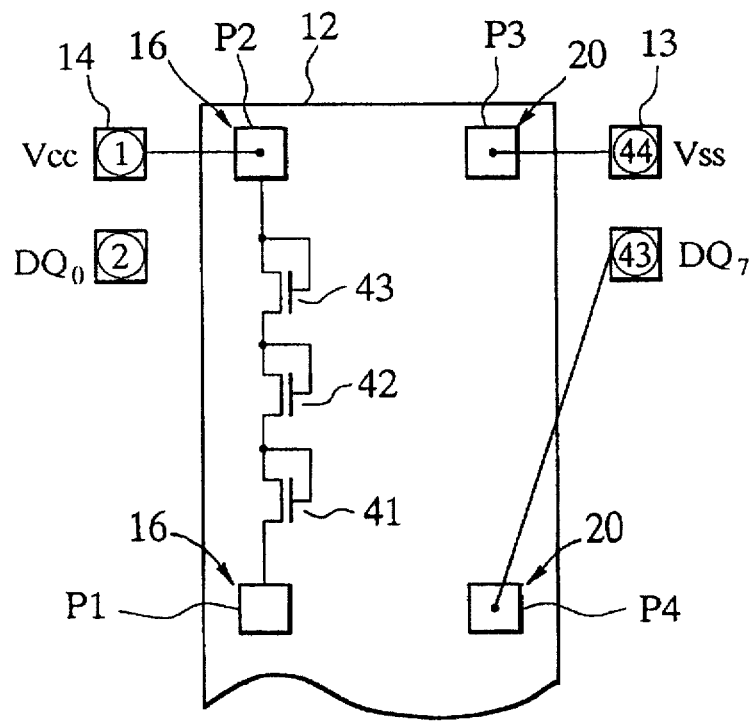

If a normal product is set during a normal die sorting process, the 44th pin of the product is set to high level H, the 43rd pin to low level L, and the 1st pin to low level L. As a result, the NMOS transistors 41 to 43 are turned ON, and a current flows between the bonding pads P1 and P2. As a result, it is determined that the product is of a normal configuration. Then, a normal test program is carried out on the product. If a reverse product is set during the normal die sorting process by mistake, no potential is applied to the bonding pad P1 of the product, the bonding pad P2 is set to level L, the bonding pad P3 to level H, and the bonding pad P4, which is irrelevant to the decision of normal type, to level L, as shown in FIG. 19. Since there is no decision circuit between the bonding pads P3 and P4, no current flows between the bonding pads P3 and P4. As a result, the product is determined to be not of a normal configuration.

Figure 20:
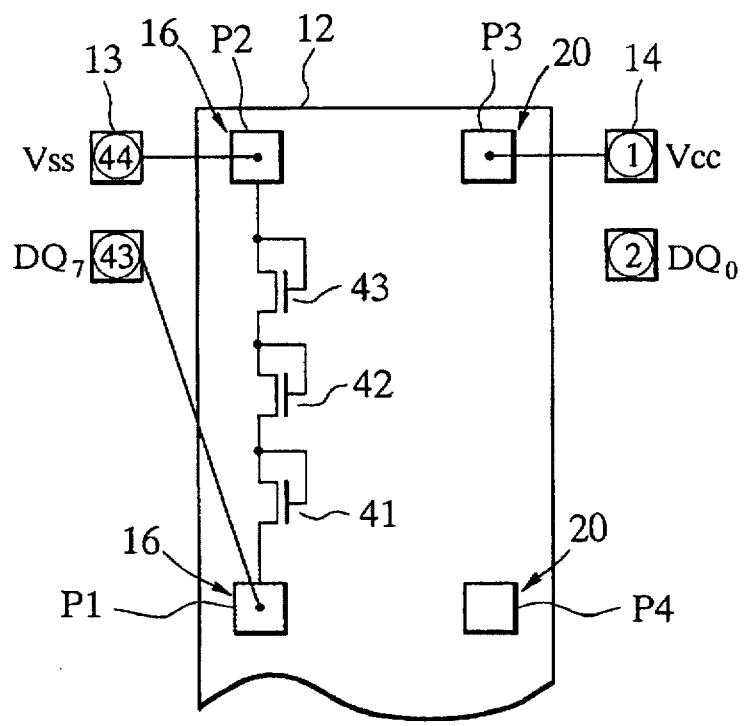

FIG. 20 shows the decision circuit mounted on a reverse semiconductor chip 12. The level setting of pins of the reverse chip 12 is the same as that of the normal chip of FIG. 18. Only the pin arrangement of FIG. 20 is opposite to that of FIG. 18. According to the same operations as those of the normal chip, a current flows between the bonding pads P1 and P2 of the reverse chip.

In this way, the decision circuit for determining a type of a semiconductor device is arranged on a semiconductor IC chip. A probe card to carry out an operation test is made to contact the bonding pads of the IC chip, to determine the type of the IC to be tested. It is not necessary for an inspector to aware of the type of a semiconductor device to be tested, thereby avoiding test errors and defective devices due to the test errors. At a product test, normal and reverse semiconductor devices will be mixed up. It is necessary, therefore, to sort the devices before the test. When the same lead frame is used for normal and reverse semiconductor devices according to the third embodiment of the present invention, it will be difficult to sort the devices after packaging them. In this case, the decision circuit of the fourth embodiment is effective to sort the devices and avoid test errors.

The decision circuit not only determines the type of a device but also a write permit status, a function option, a circuit option, or the number of refresh cycles.

Figure 21:
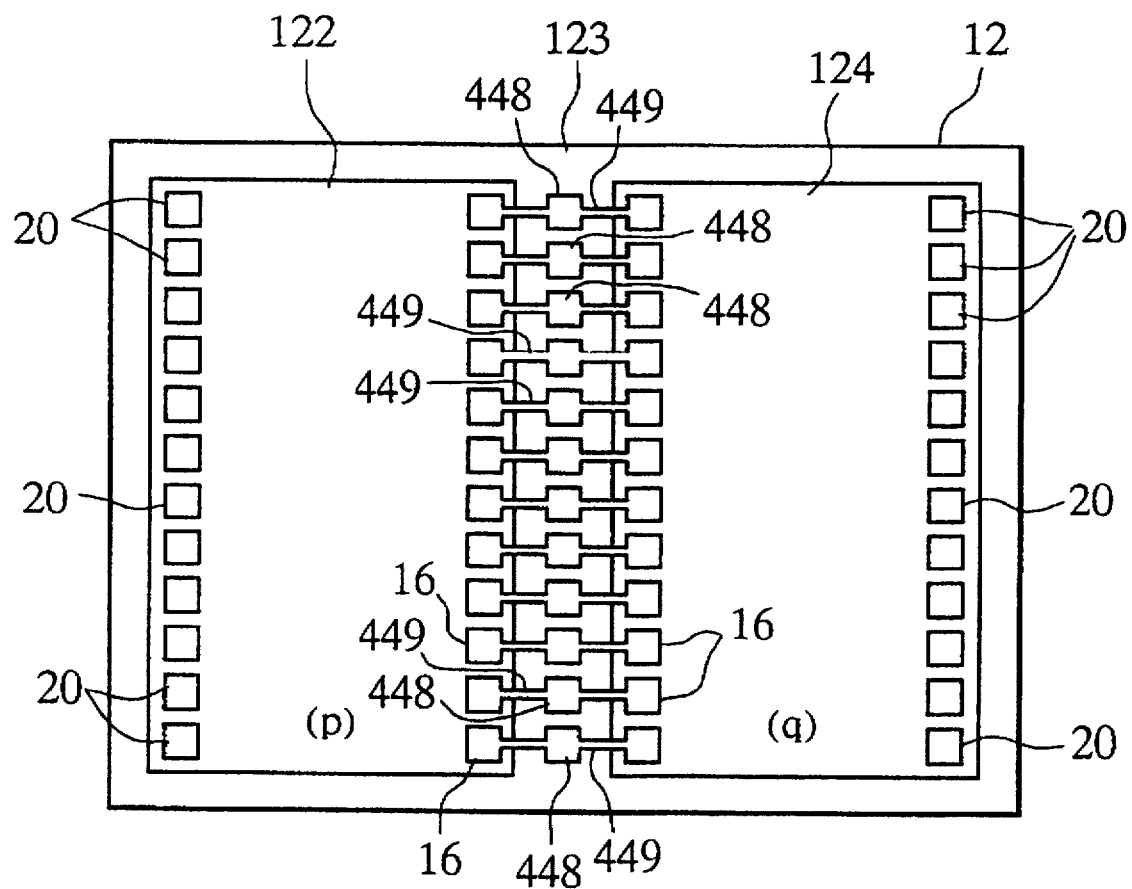
FIG. 21 is a plan view showing normal and reverse ICs connected to each other through metal wirings on a single semiconductor chip according to a fifth embodiment of the present invention.
Figure 22:
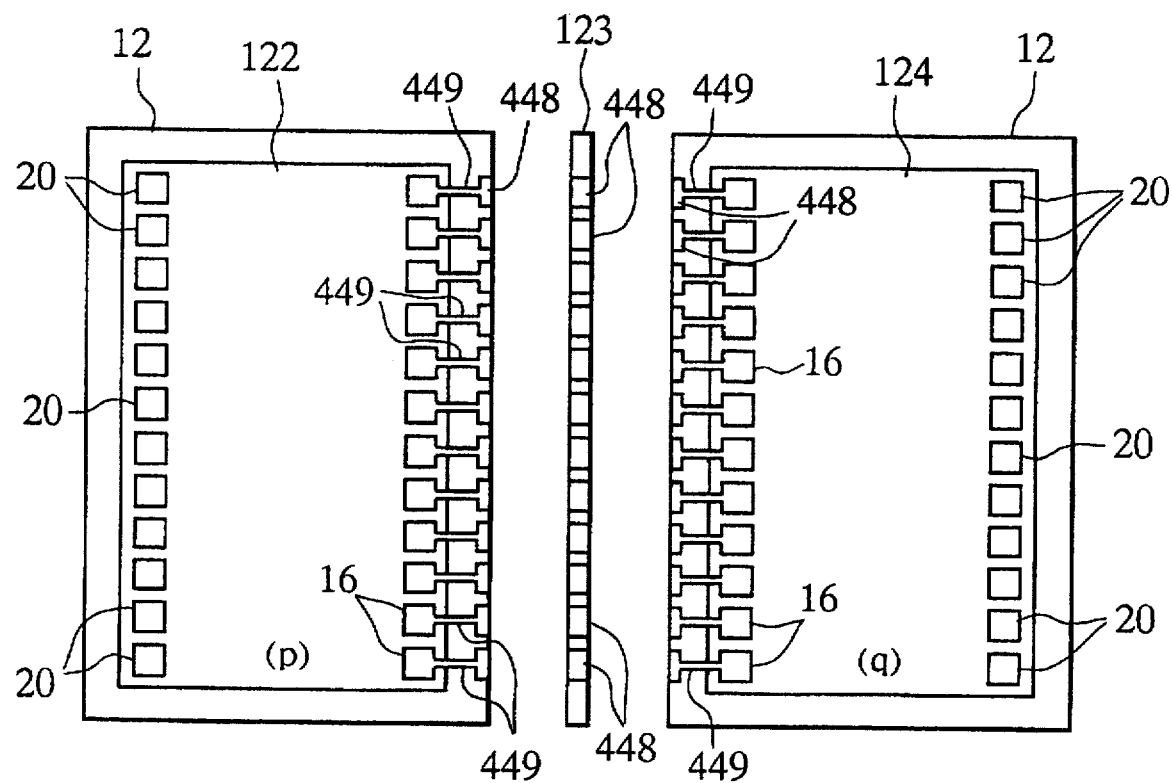
FIG. 22 is a plan view showing the normal and reverse ICs of FIG. 21 cut into separate chips.
Figure 23:
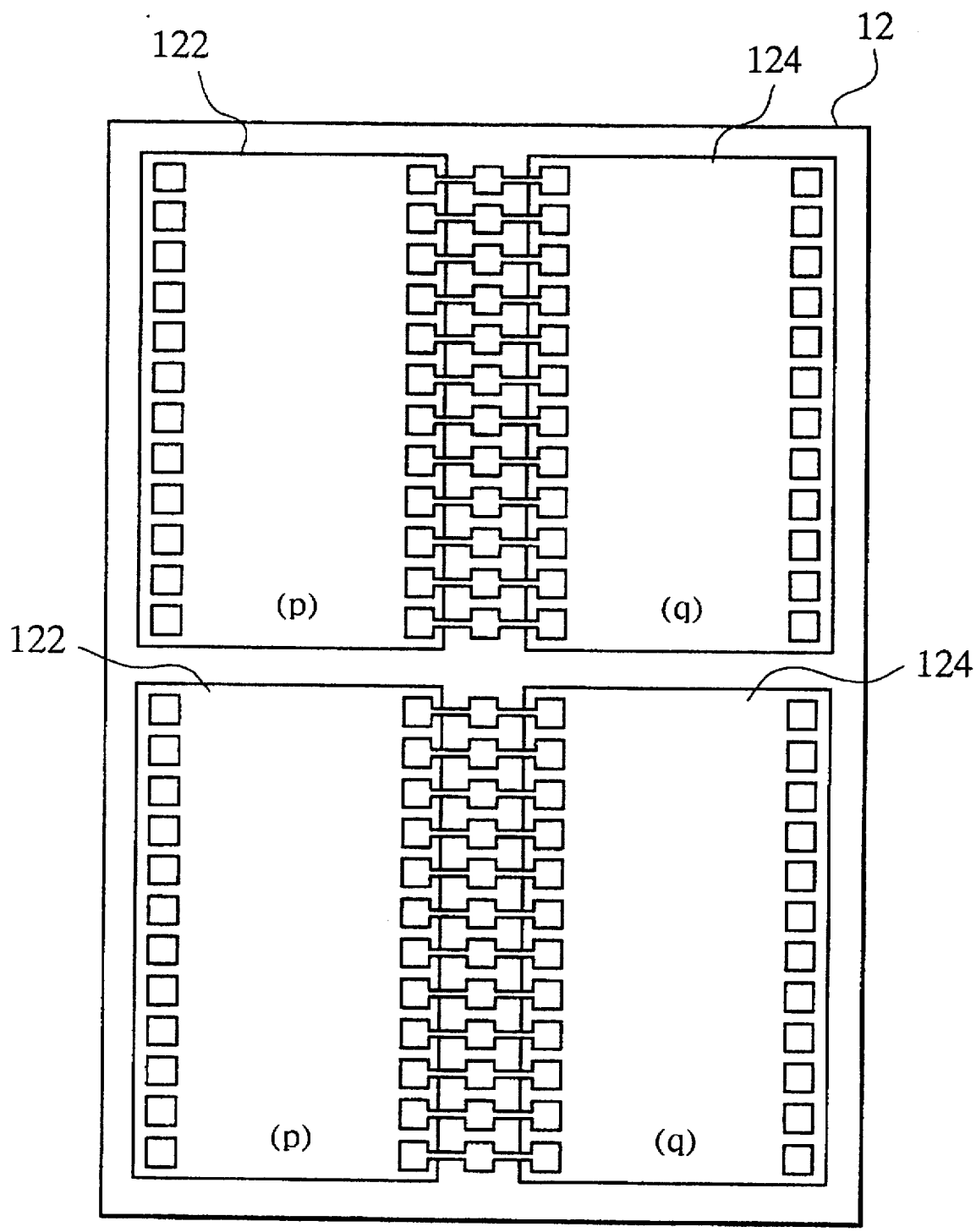
FIG. 23 is a plan view showing two normal ICs and two reverse ICs formed on a single semiconductor chip according to the fifth embodiment of the present invention.

FIG. 21 is a plan view showing a semiconductor device according to the fifth embodiment of the present invention. A semiconductor chip 12 supports a normal IC 122 and a reverse IC 124. The ICs 122 and 124 are each a mirror image of the other. Normal bonding pads 16 are connected to reverse bonding pads 16 through metal wirings 449 and bonding pads 448 formed at the center of the chip 12. The ICs 122 and 124 are each of, for example, 64 megabits. They are connected together to form a double-capacity IC, i.e., a 128-megabit IC. In this way, the fifth embodiment easily forms a double-capacity semiconductor device without newly fabricating a double-capacity mask or executing a new manufacturing process. The fifth embodiment is effective to shorten the development time and reduce the costs of large-capacity semiconductor devices. If the large capacity (double capacity) is not needed, the semiconductor chip 12 of FIG. 21 may be separated into a normal semiconductor chip and a reverse semiconductor chip, each chip being mounted on a separate lead frame, as shown in FIG. 22. Namely, the fifth embodiment can easily increase or decrease the capacity of a semiconductor device by optionally determining a dicing line without changing masks and processing steps. If two pairs of normal and reverse ICs are formed on a single chip as shown in FIG. 23, the capacity will be quadrupled.

Various modifications will become possible for those skilled in the art after receiving the teachings of the present disclosure without departing from the scope thereof.

What is claimed is:

1. A semiconductor device for mounting in a package having a plurality of outer pins, the semiconductor device comprising:
   a semiconductor wafer;
   a first integrated circuit having a first pattern of elements, a first side and a second side opposing the first side and a first centerline between the first and second sides;
   a second integrated circuit having a second pattern of elements, a third side and a fourth side opposing the third side and a second centerline between the third and fourth sides, wherein said second pattern is a mirror image of said first pattern; and
   a scribe line area between said second and third sides, wherein said first and second patterns each include a plurality of bonding pads for bonding wires through which each bonding pad is electrically connected to a respective one of said outer pins, the bonding pads are arranged along said first, second, third and fourth sides and all of said bonding pads are wholly outside of said scribe line area, and said first and second integrated circuits and said scribe line area are formed on said semiconductor wafer.

2. The semiconductor device of claim 1, wherein a test circuit is formed on said scribe line area between said second and third sides, and said test circuit is connected to both said first and second integrated circuits.

3. A semiconductor device for mounting in a package having a plurality of outer pins, the semiconductor device comprising:
   a semiconductor wafer;
   a first integrated circuit having a first pattern of elements, first opposing sides and a first centerline;
   a second integrated circuit having a second pattern of elements, second opposing sides and a second centerline, wherein said second pattern is a mirror image of said first pattern; and
   a scribe line area between said first and second integrated circuits, wherein each of said first and second patterns has a plurality of bonding pads for bonding wires through which each bonding pad is electrically connected to a respective one of said plurality of outer pins, the bonding pads being symmetrically arranged with respect to said first and second centerlines along said first and second opposing sides and wholly outside of said scribe line area, and said first and second integrated circuits and said scribe line area are formed on said semiconductor wafer.

4. The semiconductor device of claim 3, wherein each of said first and second patterns include a decision circuit to determine whether a respective integrated circuit is said first integrated circuit or said second integrated circuit.

5. The semiconductor device of claim 3, wherein selected bonding pads in each of said first and second integrated circuits are connected to each other through metal wirings formed on said scribe line area.

6. A semiconductor device comprising:
   a first package having first external I/O terminals, a first bottom surface and a first integrated circuit having a first pattern of elements and first opposing sides;
   a second package having second external I/O terminals, a second bottom surface and a second integrated circuit having a second pattern of elements and second opposing sides, wherein said second pattern is a mirror image of said first pattern, and wherein said first and second patterns each include a plurality of bonding pads respectively arranged along said first and second opposing sides; and
   a circuit board for mounting said first and second packages, the circuit board having first and second surfaces,
   wherein said first package is mounted on the first surface of said circuit board and said second package is mounted on the second surface of said circuit board, and wherein said first bottom surface faces said second bottom surface.

7. The semiconductor device of claim 6, including:

a decision circuit, wherein each of said first and second patterns include said decision circuit to determine whether a respective integrated circuit is said first integrated circuit or said second integrated circuit.

8. The semiconductor device of claim 7, wherein the decision circuit is connected to said first and second external I/O terminals of said first and second packages.

9. A semiconductor device for mounting in a package having a plurality of outer pins, the semiconductor device comprising:

a semiconductor wafer;

a first integrated circuit having a first pattern of elements, first opposing sides and a first centerline;

a second integrated circuit having a second pattern of elements, second opposing sides and a second centerline, wherein said second pattern is a mirror image of said first pattern; and a scribe line area between said first and second integrated circuits; and a test circuit formed on said scribe line area, said test circuit being connected to both said first and second integrated circuits, wherein each of said first and second patterns has a plurality of bonding pads for bonding wires through which each bonding pad is electrically connected to a respective one of said plurality of outer pins, the bonding pads being symmetrically arranged with respect to said first and second centerlines along said first and second opposing sides and wholly outside of said scribe line area, and said first and second integrated circuits and said scribe line area are formed on said semiconductor wafer.

10. The semiconductor device of claim 9, wherein each of said first and second patterns include a decision circuit to determine whether a respective integrated circuit is said first integrated circuit or said second integrated circuit.

11. The semiconductor device of claim 9, wherein selected bonding pads in each of said first and second integrated circuits are connected to each other through metal wirings formed on said scribe line area.

* * * * *